(12) United States Patent
Kajiyama et al.

(10) Patent No.: US 8,058,080 B2
(45) Date of Patent: Nov. 15, 2011

(54) METHOD OF MANUFACTURING A MAGNETIC RANDOM ACCESS MEMORY, METHOD OF MANUFACTURING AN EMBEDDED MEMORY, AND TEMPLATE

(75) Inventors: Takeshi Kajiyama, Yokohama (JP);
Yoshiaki Asao, Kawasaki (JP); Minoru Amano, Sagamihara (JP); Shigeki Takahashi, Yokohama (JP); Masayoshi Iwayama, Kawasaki (JP); Kuniaki Sugiura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/699,721

(22) Filed: Feb. 3, 2010

(65) Prior Publication Data

US 2010/0197044 A1 Aug. 5, 2010

(30) Foreign Application Priority Data

Feb. 4, 2009 (JP) ................. 2009-024102

(51) Int. Cl.
*H01L 21/00* (2006.01)
*H01L 21/20* (2006.01)
*H01L 21/36* (2006.01)

(52) U.S. Cl. ..................... 438/3; 438/478; 257/E21.461

(58) Field of Classification Search ............. 438/3, 478, 438/694; 257/E21.461, E21.486, E43.006
See application file for complete search history.

(56) References Cited

U.S. PATENT DOCUMENTS

| 7,160,477 B2 * | 1/2007 | Bandic et al. ..................... 216/22 |
| 7,341,825 B2 * | 3/2008 | Bandic et al. ................... 430/320 |
| 7,388,776 B1 * | 6/2008 | Fontana et al. ................ 365/173 |
| 7,745,813 B2 * | 6/2010 | Samuelson et al. .............. 257/12 |
| 7,854,873 B2 * | 12/2010 | Heidari et al. ................. 264/225 |
| 7,862,756 B2 * | 1/2011 | Wuister et al. ................. 264/227 |
| 7,875,313 B2 * | 1/2011 | Blanchet et al. .............. 427/282 |
| 2003/0102444 A1 * | 6/2003 | Deppert et al. ........... 250/492.22 |
| 2006/0186444 A1 * | 8/2006 | Nikonov et al. ............... 257/295 |
| 2007/0178609 A1 * | 8/2007 | Yoda ............................. 438/3 |
| 2007/0287207 A1 * | 12/2007 | Fujii .............................. 438/22 |
| 2008/0006161 A1 * | 1/2008 | Li et al. ........................... 101/32 |
| 2008/0023885 A1 * | 1/2008 | Anoikin ........................ 264/446 |
| 2008/0145617 A1 * | 6/2008 | Pethica et al. ................ 428/156 |
| 2009/0187558 A1 | 7/2009 | McDonald |
| 2009/0286379 A1 * | 11/2009 | Hong ............................ 438/406 |
| 2010/0052177 A1 * | 3/2010 | Meijer ........................ 257/773 |
| 2010/0078860 A1 * | 4/2010 | Yoneda et al. ................ 264/496 |
| 2010/0167502 A1 * | 7/2010 | Yen et al. ...................... 438/478 |
| 2010/0240151 A1 * | 9/2010 | Belen et al. ....................... 438/3 |
| 2011/0121417 A1 * | 5/2011 | Li et al. ......................... 257/421 |
| 2011/0140238 A1 * | 6/2011 | Natori et al. ................. 257/532 |

FOREIGN PATENT DOCUMENTS

JP 2007-207778 8/2007

* cited by examiner

*Primary Examiner* — Walter L Lindsay, Jr.
(74) *Attorney, Agent, or Firm* — Knobbe Martens Olson & Bear LLP

(57) ABSTRACT

A magnetic material of a magnetoresistive element is formed on a lower electrode. An upper electrode is formed on the magnetic material. A resist for nano-imprint lithography is formed on the upper electrode. A first pattern or a second pattern is formed in the resist by setting a first template or a second template into contact with the resist and curing the resist. The first template has the first pattern that corresponds to the magnetoresistive element and the lower electrode. The second template has the second pattern that corresponds to the magnetoresistive element and the upper electrode. The magnetic material and the lower electrode are patterned at the same time by using the resist having the first pattern, or the magnetic material and the upper electrode are patterned at the same time by using the resist having the second pattern.

13 Claims, 16 Drawing Sheets

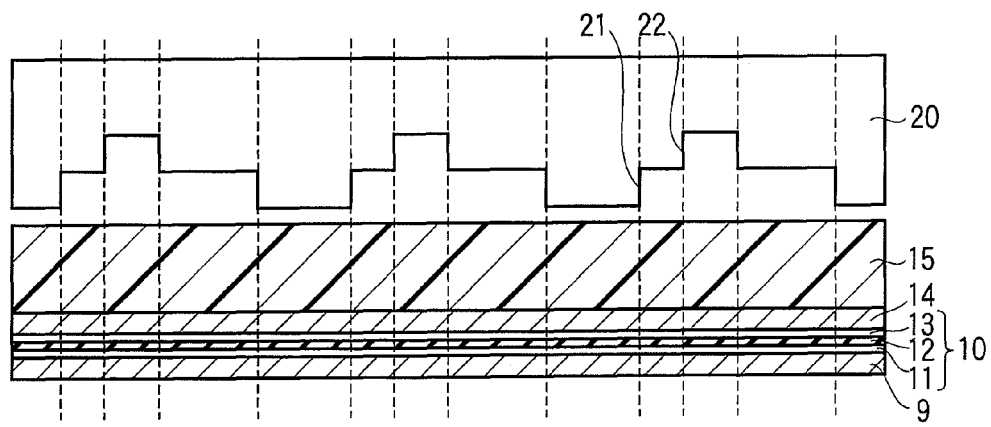
F I G. 2
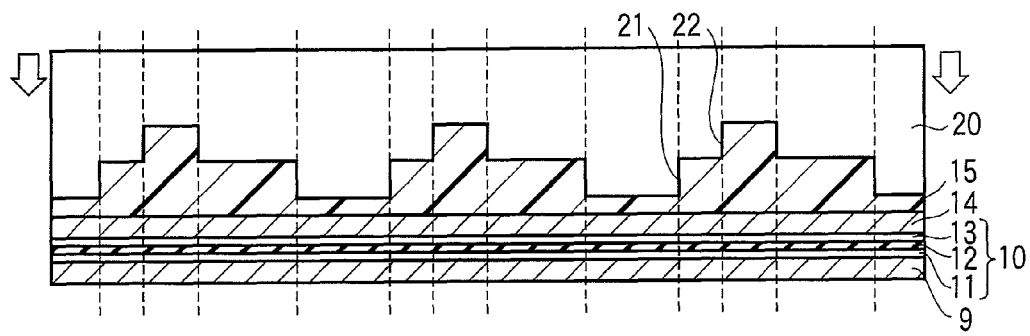
F I G. 3
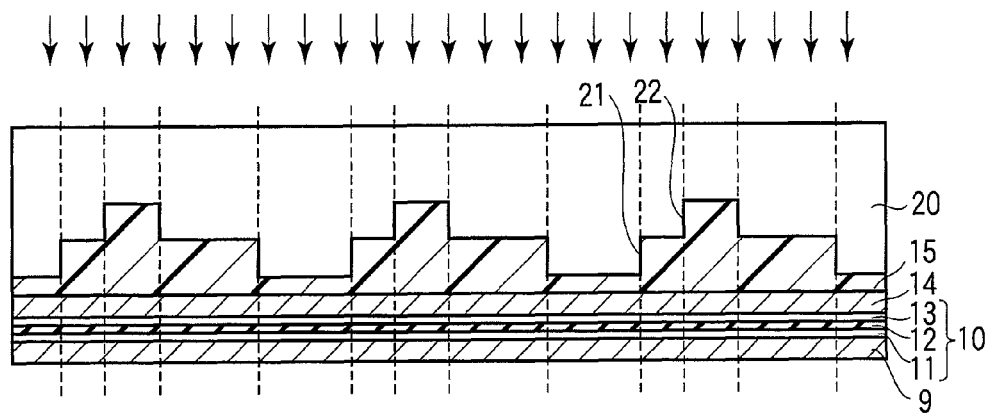
F I G. 4

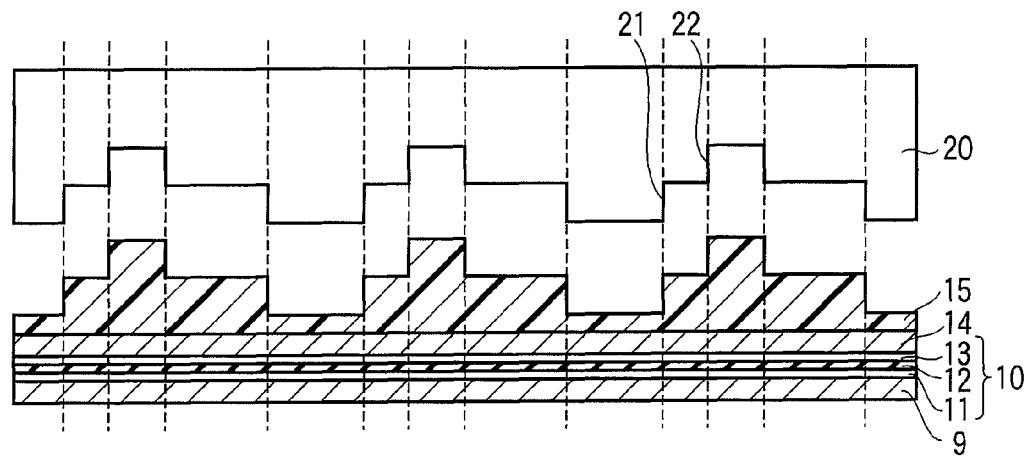
FIG. 5
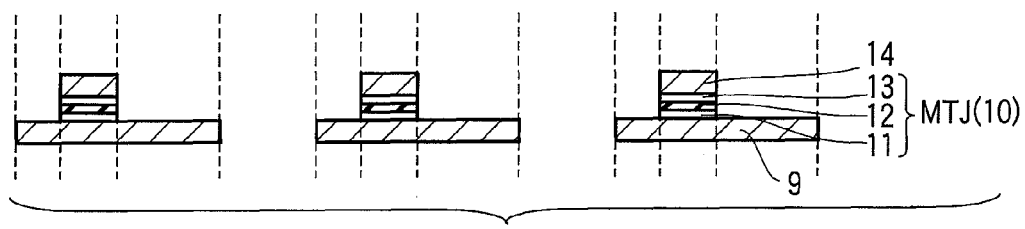
FIG. 6
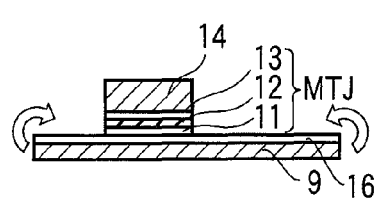 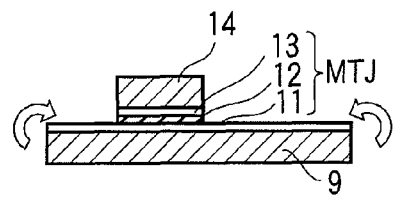
FIG. 7A   FIG. 7B

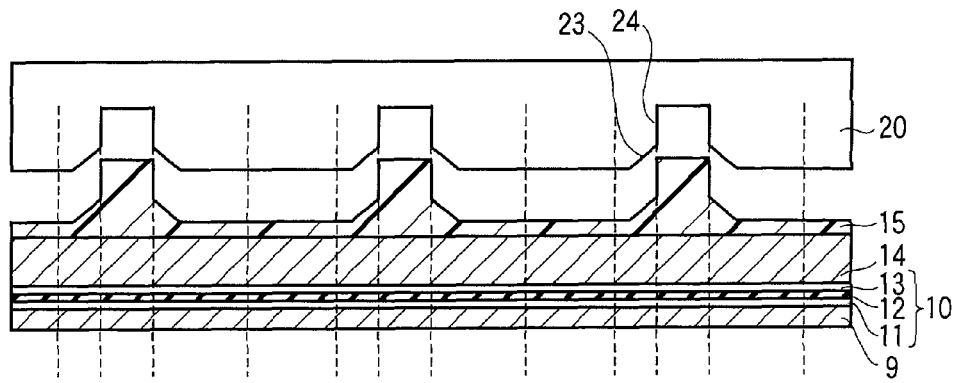
F I G. 11
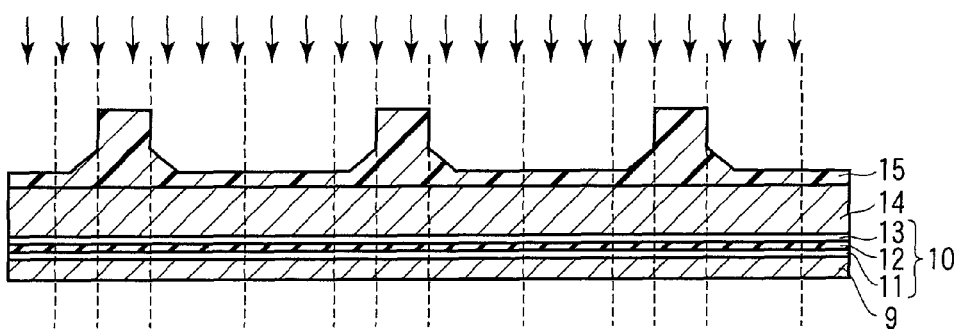
F I G. 12
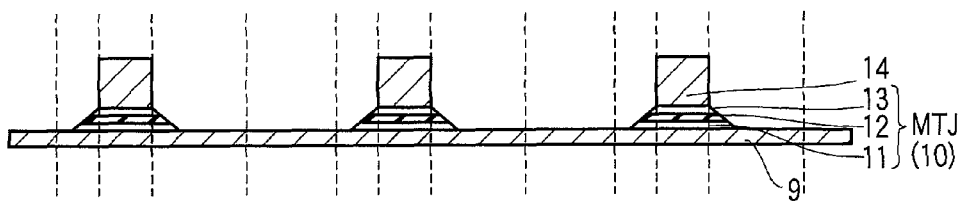
F I G. 13

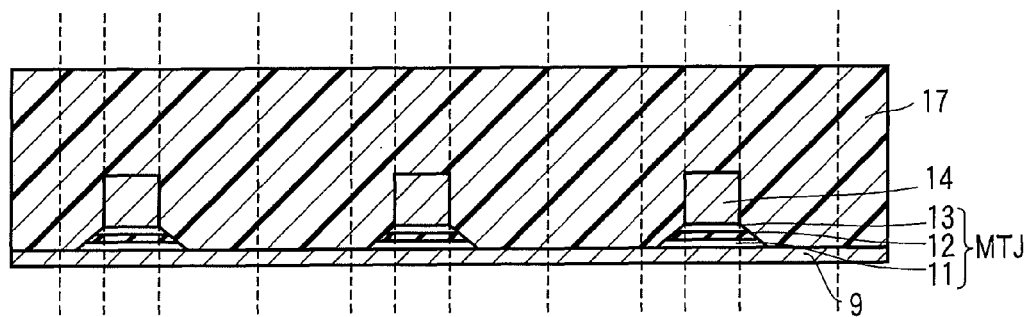
F I G. 14
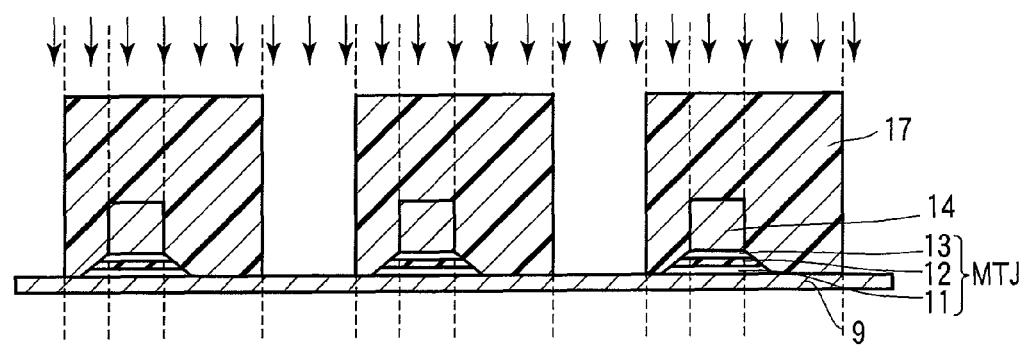
F I G. 15
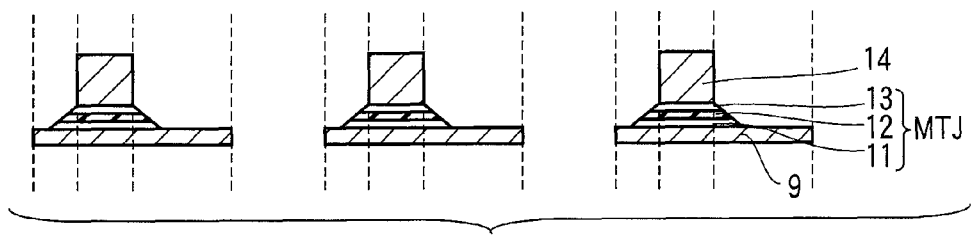
F I G. 16

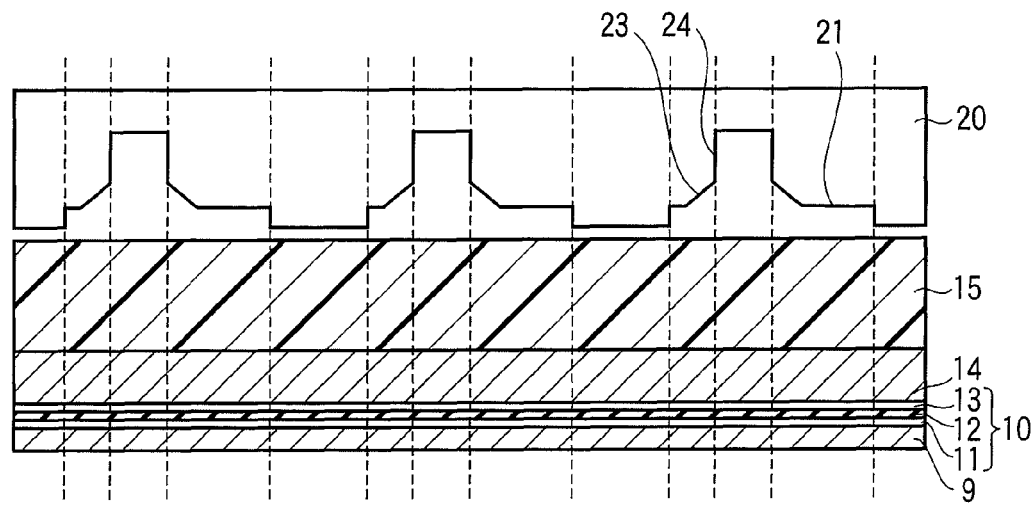
F I G. 17
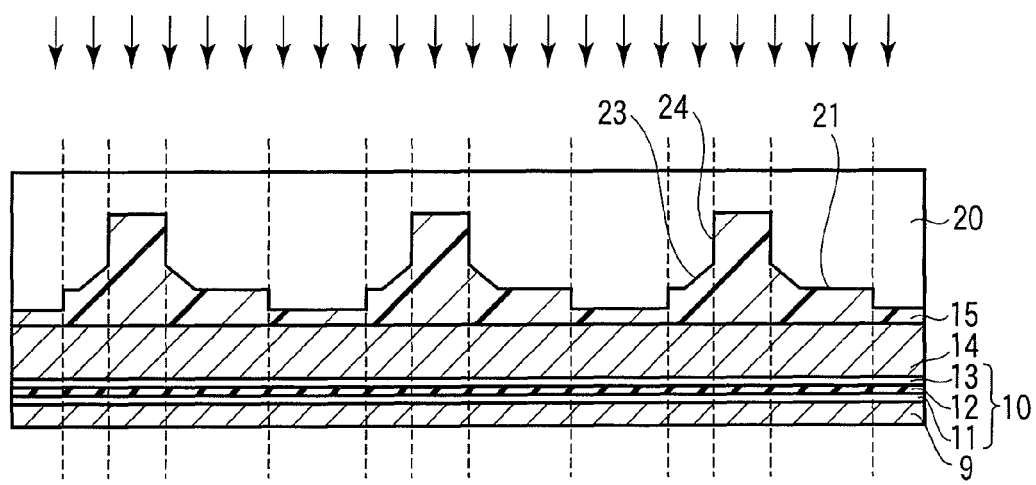
F I G. 18

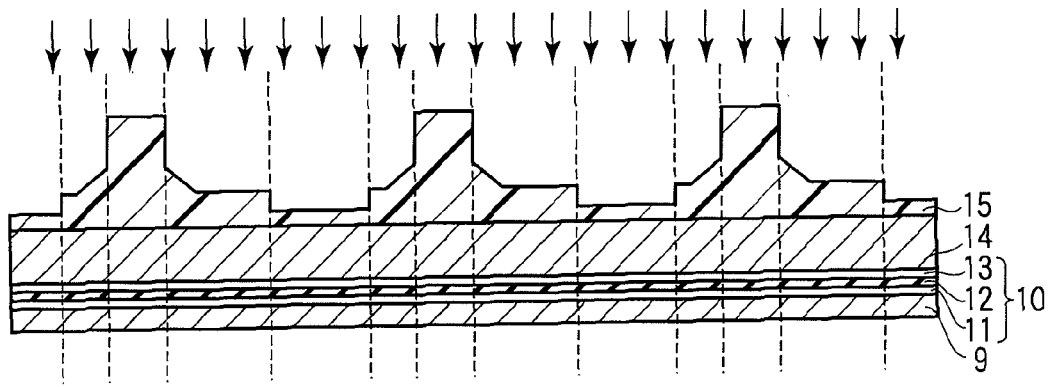
F I G. 19
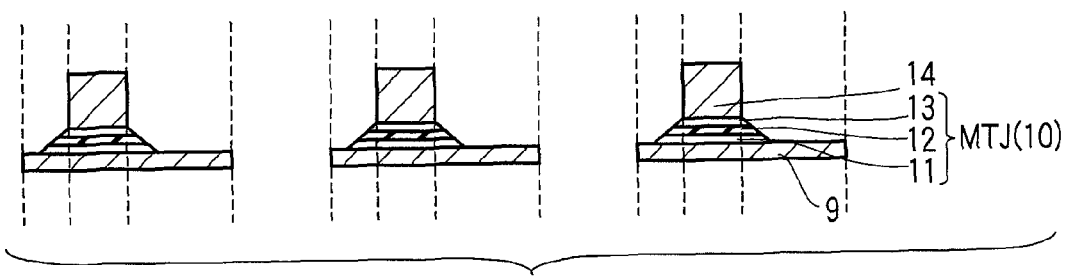
F I G. 20

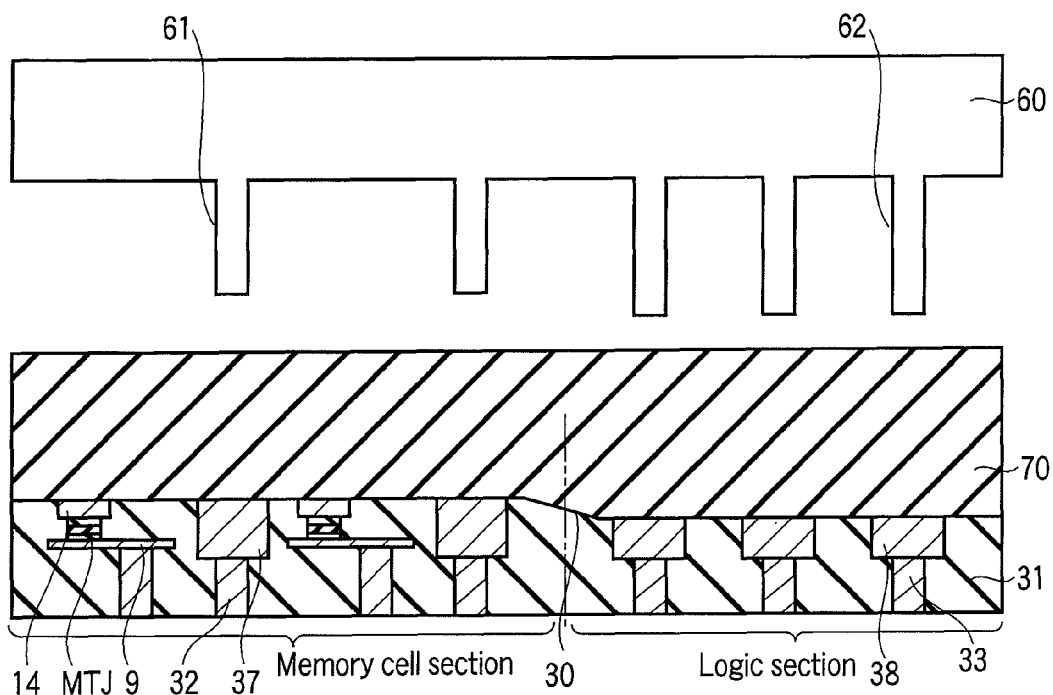
F I G. 35
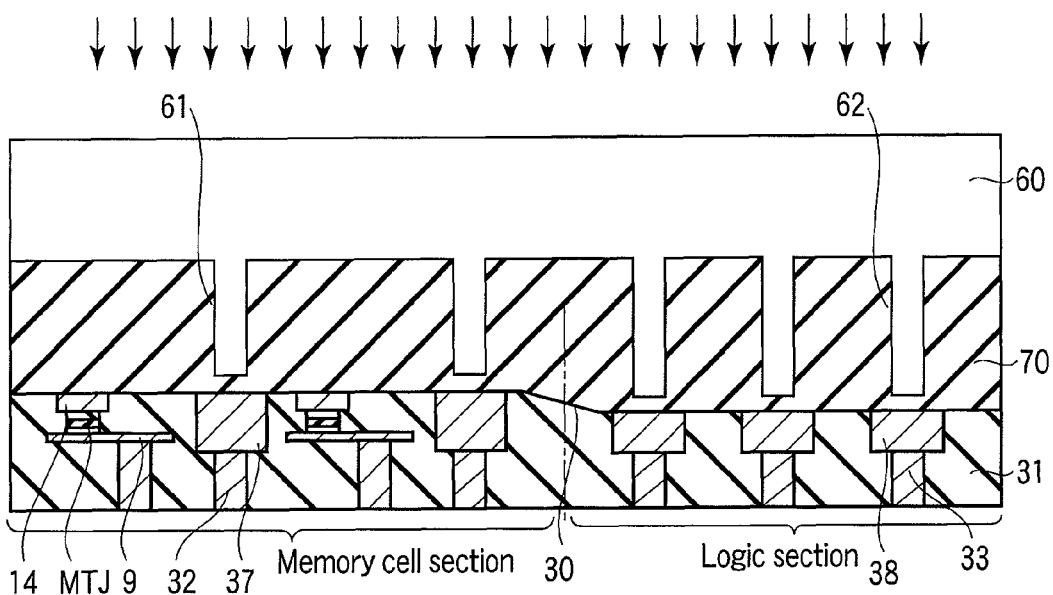
F I G. 36

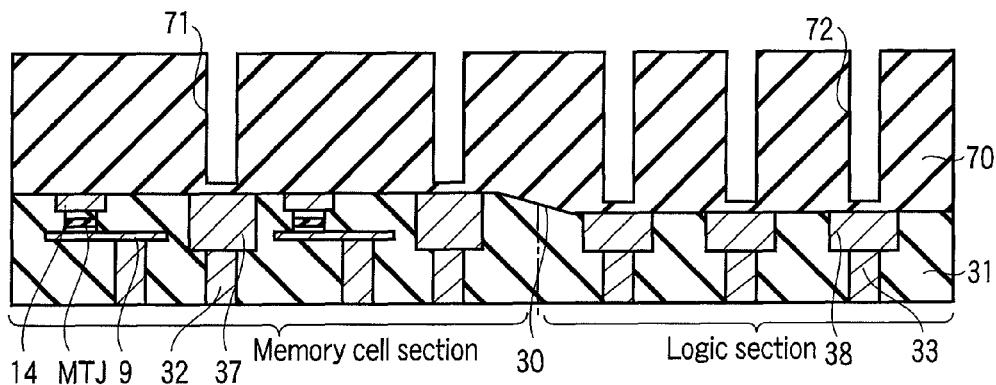
F I G. 37
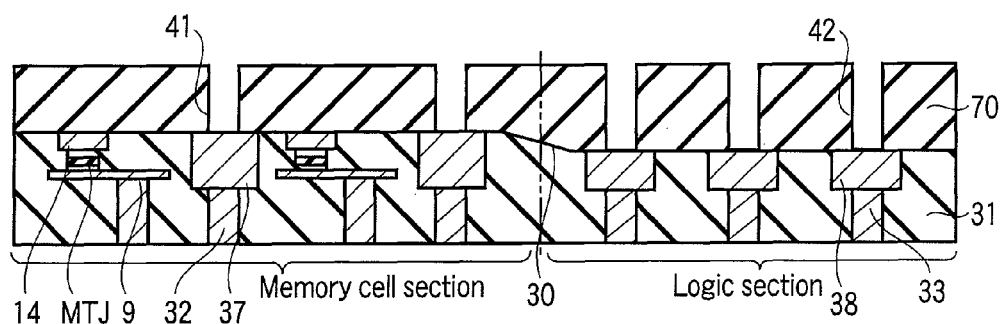
F I G. 38
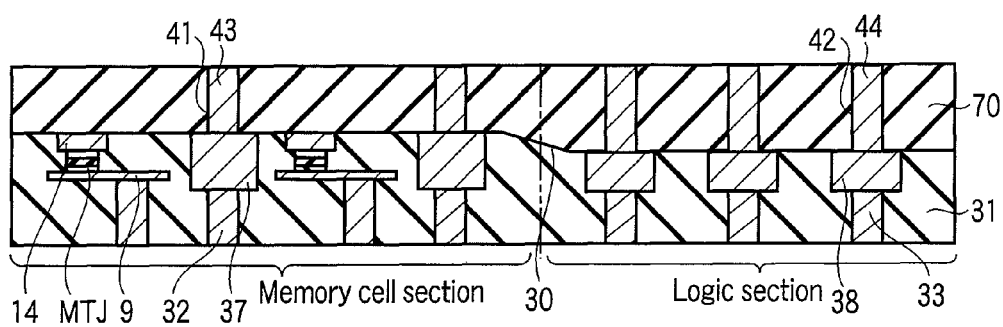
F I G. 39

METHOD OF MANUFACTURING A MAGNETIC RANDOM ACCESS MEMORY, METHOD OF MANUFACTURING AN EMBEDDED MEMORY, AND TEMPLATE

CROSS-REFERENCE TO RELATED APPLICATIONS

This application is based upon and claims the benefit of priority from prior Japanese Patent Application No. 2009-024102, filed Feb. 4, 2009, the entire contents of which are incorporated herein by reference.

BACKGROUND OF THE INVENTION

1. Field of the Invention

The present invention relates to a method of manufacturing a magnetic random access memory, by using nano-imprint lithography, and also to a method of manufacturing an embedded memory.

2. Description of the Related Art

Magnetic tunnel-junction (MTJ) elements used in any magnetic random access memory (MRAM) comprise upper and lower magnetic material, and a tunnel insulating film formed between the upper and lower magnetic material. The flatness of the films greatly influences the characteristic of the MTJ element. The flatness of the MTJ element on a lower electrode must therefore be increased in order to enhance the characteristic. Further, no MTJ element can be formed immediately above a contact connected to a transistor. The alignment margin of between the MTJ element and the lower electrode can be selected. The alignment margin of between the MTJ element and the lower electrode pattern influences the memory-cell size.

A nonvolatile RAM, such as MRAM, is embedded together with logic circuits in many cases, because of its characteristic. Therefore, the memory section must be embedded between the logic-circuit layers developed. However, the wirings of the memory section and the logic section must be formed different in height, in the same plane. Consequently, the wirings of the memory section are not aligned with those of the logic section.

Jpn. Pat. Appln. KOKAI Publication No. 2007-207778 is cited herein as a prior-art document that pertains to the present invention.

BRIEF SUMMARY OF THE INVENTION

According to an aspect of the first invention, there is provided a method of forming a magnetic random access memory. The method comprises: forming a magnetic material for a magnetoresistive element, on a lower electrode; forming an upper electrode on the magnetic material; forming a resist for nano-imprint lithography, on the upper electrode; forming a first pattern or a second pattern in the resist by setting a first template or a second template into contact with the resist and curing the resist, thereby, wherein the first template has the first pattern corresponding to the magnetoresistive element and the lower electrode and the second template has the second pattern corresponding to the magnetoresistive element and the upper electrode; and patterning the magnetic material and the lower electrode at the same time by using the resist having the first pattern, or patterning the magnetic material and the upper electrode at the same time by using the resist having the second pattern.

According to another aspect of the first invention, there is provided a method of manufacturing an embedded memory in which first wirings in a memory cell section and wirings in a logic section differ in height. This method comprises: forming a first interlayer insulting film on a first contact of the memory cell section and a second contact of the logic section, the first interlayer insulting film having a step located between the memory cell section and the logic section; forming a first resist for nano-imprint lithography, on the first interlayer insulating film; forming a pattern of the first wiring and a pattern of the second wiring in the first resist by setting a first template into contact with the first resist and curing the first resist, the first template having the patterns corresponding to the first and second wirings; forming a first wiring groove exposing the first contact and a second wiring groove exposing the second contact by patterning the first interlayer insulating film by using the first resist; and forming the first wiring and the second wiring different in height, in the same plane at the same time by forming metal materials in the first and second wiring grooves.

According to a further aspect of the first invention, there is provided a template for nano-imprint lithography, used in patterning a memory cell section of a magnetic random access memory that has a lower electrode, a magnetoresistive element on the lower electrode, and an upper electrode on the magnetoresistive element. The template has a pattern of the magnetoresistive element and a pattern of the lower electrode, or a pattern of the magnetoresistive element and a pattern of the upper electrode.

BRIEF DESCRIPTION OF THE SEVERAL VIEWS OF THE DRAWING

FIGS. 2, 3, 4, 5 and 6 are sectional views explaining the sequence of manufacturing a magnetic random access memory according to the first embodiment of this invention;

FIG. 7A and FIG. 7B are sectional views showing an MTJ element and lower electrodes according to the first embodiment of this invention;

FIGS. 9, 10, 11, 12, 13, 14, 15, and 16 are sectional views explaining the sequence of manufacturing a magnetic random access memory according to the second embodiment of this invention;

FIGS. 17, 18, 19 and 20 are sectional views explaining the sequence of manufacturing a magnetic random access memory according to a third embodiment of this invention;

FIGS. 35, 36, 37, 38 and 39 are sectional views explaining the sequence of manufacturing a magnetic random access memory according to a sixth embodiment of this invention.

DETAILED DESCRIPTION OF THE INVENTION

Figure 1A:
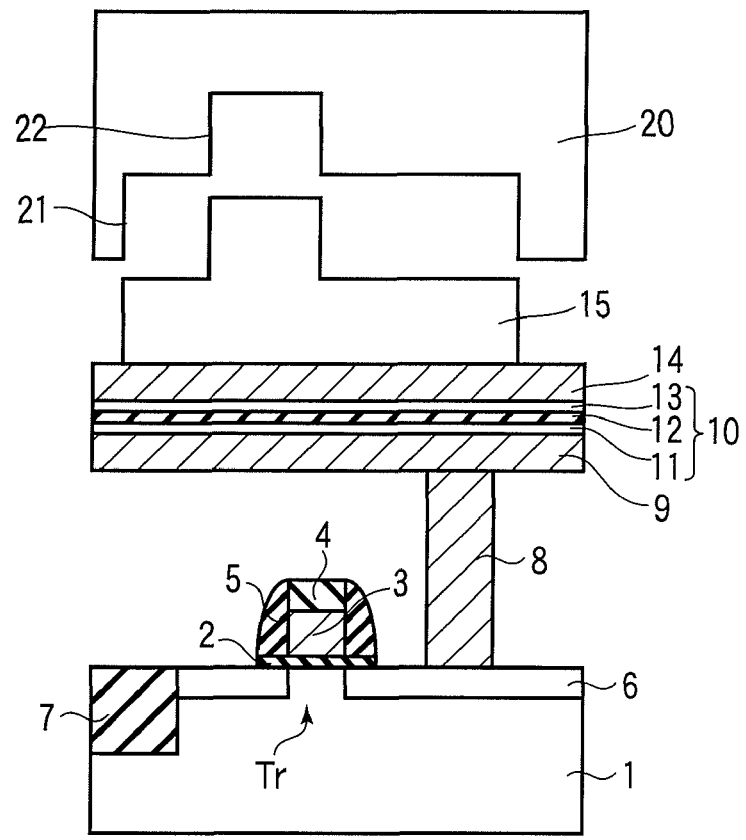
FIG. 1A and FIG. 1B are sectional views of a template used in manufacturing a memory cell of a magnetic random access memory according to a first embodiment of this invention and the memory cell manufactured by using the template.

Embodiments of the present invention will be described with reference to the accompanying drawings. In the drawings, the same reference symbols are attached to common portions.

[1] First Embodiment

The first embodiment uses a template that serves to simultaneously form two layers comprising an MTJ element and a lower electrode in nano-imprint lithography.

[1-1] Template

Figure 1B:
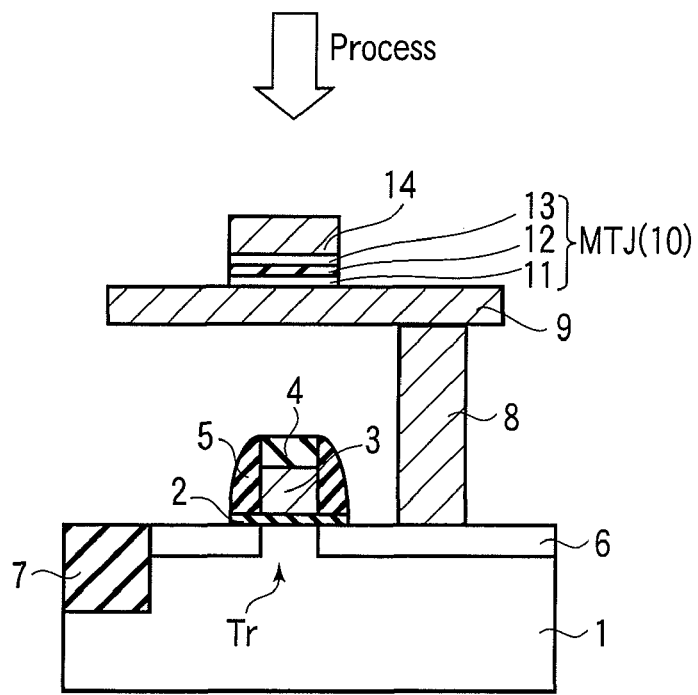

FIG. 1A and FIG. 1B are sectional views of a template used in manufacturing a memory cell of a magnetic random access memory according to a first embodiment of this invention and the memory cell manufactured by using the template. The template used in the first embodiment will be described below.

As shown in FIG. 1A, a transistor Tr is formed on a semiconductor substrate 1. The source/drain diffusion layer 6 of this transistor Tr is electrically connected to a contact 8. On this contact 8, a lower electrode (base metal layer) 9, an MTJ material layer 10, an upper electrode 14, and a resist 15 are formed in order. The resist 15 has been processed into patterns of the MTJ element and lower electrode 9 by nano-imprint lithography using the template 20 and has a step structure stacked two layers.

The patterns of the MTJ element and lower electrode 9, which constitute the template 20, are formed at the same time. That is, recess 21 defining the pattern of the lower electrode 9 is formed from the surface to the inside of the template 20, and recess 22 defining the pattern of the MTJ element is formed from a part of the bottom surface to inside of the recess 21. As a result, two layer patterns for the MTJ element and the lower electrode 9, respectively, are formed in the same template 20, one positioned above the other in the direction of height.

Using the resist 15 as shown in FIG. 1A as an etching mask, as shown in FIG. 1B, the lower electrode 9 and the MTJ element put on the lower electrode 9 can be formed by performing etching only once.

[1-2] Manufacturing Method

FIG. 2 to FIG. 6 are sectional views explaining the sequence of manufacturing the magnetic random access memory according to the first embodiment of this invention. A method of manufacturing the magnetic random access memory according to the first embodiment will be explained below.

First, as shown in FIG. 2, an MTJ material layer 10 is formed on a lower electrode 9. The MTJ material layer 10 is composed of a fixing layer 11, a tunnel barrier layer 12, and a recording layer 13 in order. The upper electrode 14 is then formed on the MTJ material layer 10. Further, the upper electrode 14 is coated with the resist 15 for nano-imprint lithography. The resist 15 is made of photo-setting resin or thermo-setting resin. Meanwhile, the template 20 is prepared, which is made of material that allows passage of ultraviolet rays (UL rays). The template 20 has two steps of recesses 21 and 22. The recess 21 defines the pattern of the lower electrode 9, and the recess 22 defines the pattern of the MTJ element.

Next, as shown in FIG. 3, the template 20 is set into contact with the resist 15. As a result, the recesses 21 and 22 made in the template 20 are filled with the resist 15.

Then, as shown in FIG. 4, light is applied to the resist 15 that remains in contact with the template 20. The resist 15 is thereby cured.

Further, as shown in FIG. 5, the resist 15 and the template 20 are separated from each other. That is, the template 20 used as a mold is released from the resist 15.

Next, as shown in FIG. 6, the upper electrode 14, MTJ material layer 10 and lower electrode 9 are processed by anisotropic etching, such as RIE or IBE, or milling, using the resist 15 as an etching mask. The two layers comprising the MTJ element MTJ and the lower electrode 9 can thus be processed by performing PEP only once. Note that resist 15 is removed at the same time that the upper electrode 14, and MTJ material layer 10 and lower electrode 9 are etched.

[1-3] Effect

In the first embodiment described above, a two-layer pattern for the MTJ element MTJ and lower electrode 9 is formed in the template 20 for use in the nano-imprinting. The template 20 is then used to process the resist 15. Using the resist 15 thus processed, the two layers comprising MTJ material layer 10 and lower electrode 9 are processed simultaneously. The position of the MTJ material layer 10 and the position of the lower electrode 9 are determined by the pattern of the recesses 21 and 22 made in the template 20. Hence, the MTJ material layer 10 and lower electrode 10 are not misaligned as in the case where PEP is performed two times in order to form the MTJ material layer 10 and the lower electrode 9, respectively. This can suppress the characteristic degradation resulting from a process loss, such as misalignment. In addition, the process cost can be reduced, because the two layers are formed at the same time. Moreover, there is no need to set the alignment margin as large as that required in the conventional method. This serves to decrease the memory-cell area, ultimately increasing the storage capacity of the memory.

In the magnetic random access memory, a magnetic layer 16 may be laid on the lower electrode 9 as shown in FIG. 7A, in order to improve the crystallinity and to adjust the shift of the recording layer 13. In this case, the influence of the leakage magnetic field emanating from the magnetic layer 16 varies due to the misalignment of the MTJ element MTJ and the lower electrode 9 if these two layers are made at different times as in the conventional method. This variation of the influence changes the characteristic of the recording layer 13, ultimately reducing the write/read margin. In the present embodiment, the two-layer pattern comprising the MTJ element MTJ and the lower electrode 9 can be formed simultaneously, as described above. Thus, the changes in magnetic characteristic can be suppressed. Furthermore, the memory according to this embodiment can therefore have a broad write/read margin, and can therefore be a very advantageous device.

As shown in FIG. 7B, the fixing layer 11 of the MTJ element MTJ may be formed in the same size as the lower electrode 9. If this is the case, the leakage magnetic field emanating from the magnetic layer 16 may influence the recording layer 13. Nonetheless, the problem resulting from the changes in magnetic characteristic can be solved in the present embodiment.

[2] Second Embodiment

No volatile gas is available that can achieve clear-cut etching on magnetic materials in the manufacture of magnetic random access memories. Further, use of halogen-based etching gases is likely to result in corrosion. Therefore, etching involving highly critical physical properties is often performed. If the MTJ material layer, as well as the lower electrode 9, is etched, the material of the underling layer will be re-deposited on the sidewalls of the tunnel barrier layer 12. This may result in the short-circuiting of the fixing layer 11 and recording layer 13.

Hence, in the process of forming the cells of the magnetic random access memory, taper etching is often performed at a desired angle ranging from 45° to 85°. The milling ion beam is thereby easily applied, successfully preventing short-circuiting.

The upper electrode 14 must be formed so that it may work as a contact that electrically connects the MTJ element and a bit wiring. In most cases, the upper electrode 14 having sidewalls standing at almost 90° is first formed, and the MTJ element is then etched to have its sidewalls tapered. In the course of this etching, however, the sidewalls of the upper electrode 14 may be occasionally tapered, too, and may thus be scraped. If this occurs, the contact property of the upper electrode 14 will be impaired. Further, to perform the taper etching successfully, the angle of the ion-beam gun must be adjusted to apply the ion beam at a small angle. In order to achieve this, a special device must be used and an additional step must be performed. This inevitably lengthens the process time, which is a problem to the mass-production of the magnetic random access memory.

In view of this, the second embodiment uses a template that can serve to process two layers, i.e., MTJ element and upper electrode 14, simultaneously during the nano-imprint lithography, thereby tapering only the sidewalls of the MTJ element.

The template used in the second embodiment has a two-step pattern, like the template used in the first embodiment.

However, unlike in the first embodiment, the second embodiment uses the template that is not stacked the two layers, but one layer comprising the MTJ element and the upper electrode. Rather, by using the template, the resist is so patterned to give the MTJ element tapered sidewalls.

[2-1] Template

Figure 8A:
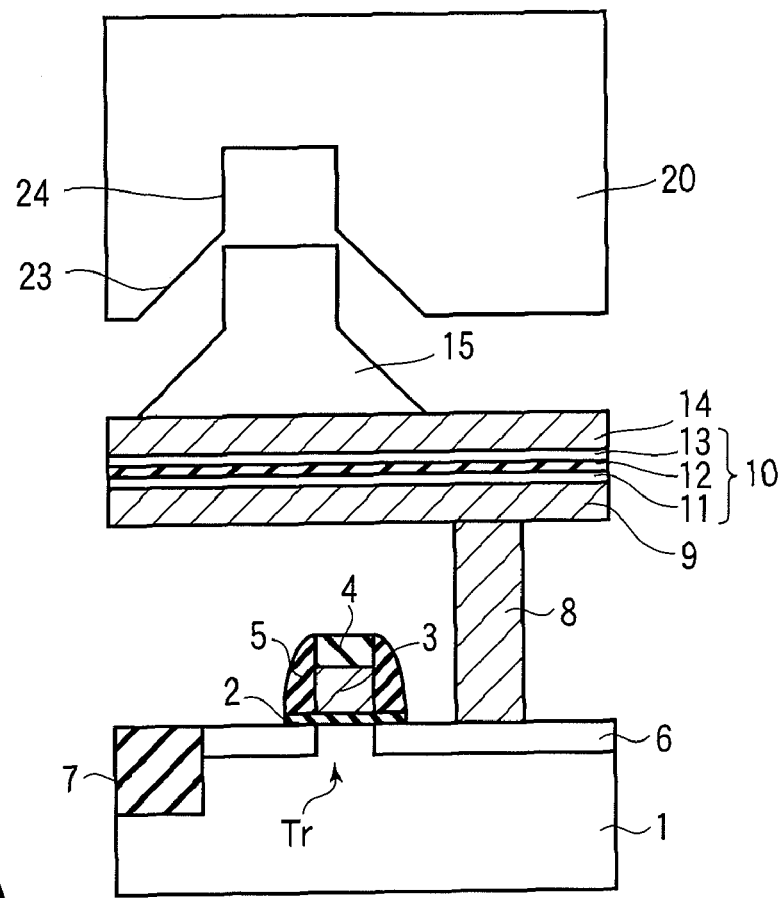
FIG. 8A and FIG. 8B are sectional views of a template used in manufacturing a memory cell of a magnetic random access memory according to a second embodiment of this invention and the memory cell manufactured by using the template.
Figure 8B:
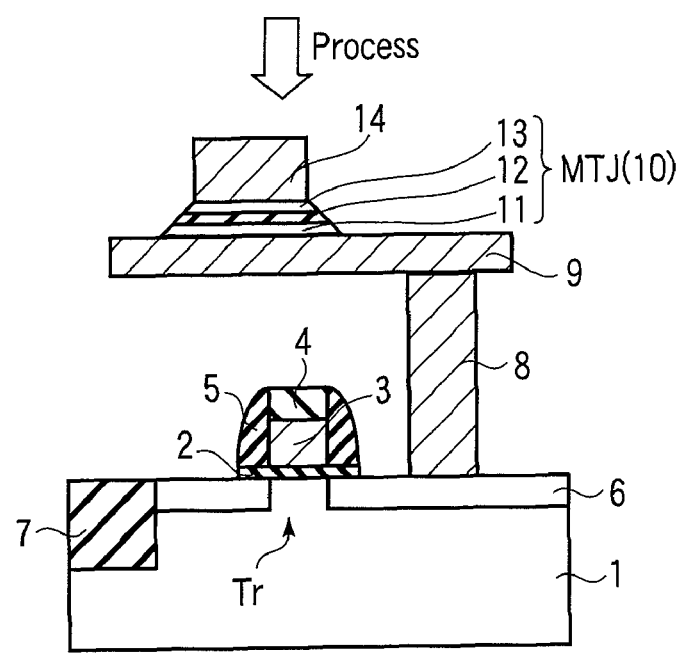

FIG. 8A and FIG. 8B are sectional views of a template used in manufacturing a memory cell of a magnetic random access memory according to a second embodiment of this invention and the memory cell manufactured by using the template. The template used in the second embodiment will be described below.

As shown in FIG. 8A, the resist 15 according to this embodiment has been processed into patterns of the MTJ element MTJ and upper electrode 14 by nano-imprint lithography using the template 20, and has a step structure comprising two patterns. Those side walls of the resist 15, which correspond to the sidewalls of the MTJ element MTJ, are tapered.

The template 20 according to this embodiment has two patterns formed at the same time, for the MTJ element MTJ and the upper electrode 14, respectively. More precisely, recess 23 defining the pattern of the MTJ element MTJ is formed from the surface to the inside of the template 20, and recess 24 defining the pattern of the upper electrode 14 is formed from the bottom surface to inside of the recess 23. The recess 23 is gradually narrow inwards from the surface of the template 20. The recess 24 is extending perpendicular. Thus, two patterns for the MTJ element MTJ having tapered sidewall and the upper electrode 14 having perpendicular sidewall, respectively, are made in the same template 20, one positioned above the other in the direction of height.

Using the resist 15 shown in FIG. 8A as an etching mask, the structure is etched. As a result, the MTJ element MTJ having tapered sidewalls and the upper electrode 14 having sidewalls standing at 90°, as illustrated in FIG. 8B, are formed in one etching step.

[2-2] Manufacturing Method

FIG. 9 to FIG. 16 are sectional views explaining the sequence of manufacturing the magnetic random access memory according to the second embodiment of this invention. A method of manufacturing the magnetic random access memory according to the second embodiment will be explained below.

Figure 9:
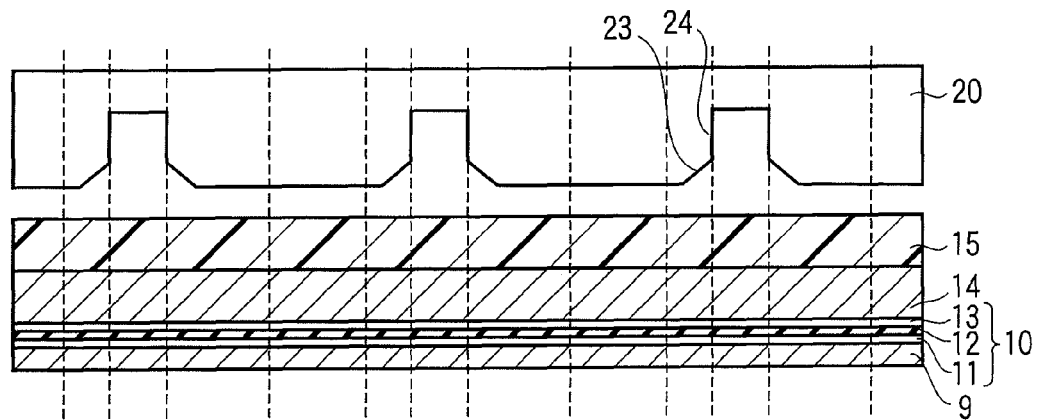

First, as shown in FIG. 9, an MTJ material layer 10, an upper electrode 14, and a resist 15 are formed on a lower electrode 9 in order. Meanwhile, a template 20 is prepared, which has two recesses 23 and 24 positioned one above the other. The recess 23 defines the pattern of an MTJ element MTJ, and the recess 24 defines the pattern of the upper electrode 14.

Figure 10:
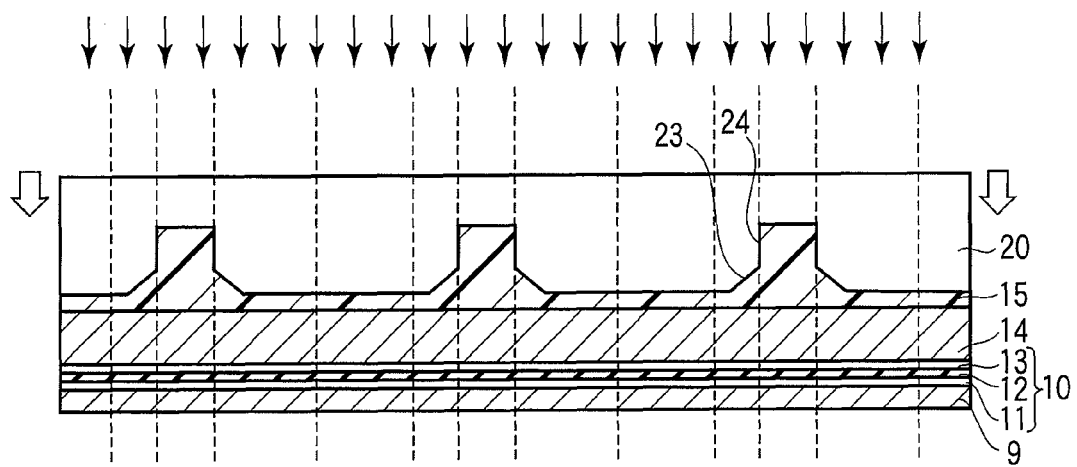

Next, as shown in FIG. 10, the template 20 is set into contact with the resist 15. As a result, the recesses 23 and 24 made in the template 20 are filled with the resist 15. Thereafter, light is applied to the resist 15 that remains in contact with the resist 15. The resist 15 is thereby cured.

Further, as shown in FIG. 11, the resist 15 and the template 20 are separated from each other. That is, the template 20 used as a mold is released from the resist 15.

Next, as shown in FIG. 12, the upper electrode 14 and the MTJ material layer 10 are processed by anisotropic etching, such as RIE or IBE, or milling, using the resist 15 as a mask.

As a result, two layers comprising the upper electrode 14 and the MTJ element MTJ can be processed by performing PEP only once, as shown in FIG. 13. In addition, the sidewalls of only the MTJ element MTJ can be tapered.

Next, as shown in FIG. 14, the upper electrode 14 and the lower electrode 9 are coated with a resist 17 for use in photolithography.

Then, as shown in FIG. 15, the ordinary photolithography is performed, patterning the resist 17. Thereafter, the lower electrode 9 is etched, by using as mask the resist 17 thus patterned.

As a result, the MTJ element having desirable tapered sidewalls and lower electrode Scan be obtained as shown in FIG. 16.

[2-3] Effect

In the second embodiment, two patterns, i.e., recesses 23 and 24 for the MTJ element MTJ and upper electrode 14, is formed in the template 20 for use in the nano-imprinting. The template 20 having the recesses 23 and 24 is used, thereby tapering the sidewalls of the MTJ element MTJ, while maintaining the sidewalls of the upper electrode 14 standing at 90°. Using the resist 15 processed by the use of the template 20, the upper electrode 14 and the MTJ material layer 10 are simultaneously processed. This solves the problem that the upper electrode 14 may otherwise be scraped when the MTJ element MTJ is etched. Moreover, an MTJ element MTJ having tapered parts and free of junction short-circuiting can be formed at the same time. Still further, since the upper electrode 14 and the MTJ material layer 10 are processed simultaneously, no misalignment occurs, which prevents characteristic degradation and reduces the process cost.

In principle, isolated resist patterns of remained shapes can be easily formed in the nano-imprinting method. This is why the upper electrode 14 and the tapered parts of MTJ element MTJ can be controlled in terms of size. Like the first embodiment, the second embodiment can therefore provide a device in which the changes in MTJ characteristic can be suppressed and which has a broad write/read margin.

[3] Third Embodiment

A third embodiment of this invention is a combination of the first and second embodiments. The third embodiment uses a template that serves to form three layers comprising the lower electrode, the MTJ element, and the upper electrode, at the same time in nano-imprint lithography.

[3-1] Manufacturing Method

FIG. 17 to FIG. 20 are sectional views explaining the sequence of manufacturing a magnetic random access memory according to the third embodiment of this invention. A method of manufacturing the magnetic random access memory according to the third embodiment will be explained below.

First, as shown in FIG. 17, an MTJ material layer 10, an upper electrode 14, and a resist 15 are formed on a lower electrode 9 in order. The resist 15 is thicker than the resist 15 used in the first and second embodiments. Meanwhile, a template 20 is prepared, which has three steps of recesses, 21, 23 and 24. The recess 21 defines the pattern of the lower electrode 9, the recess 23 defines the pattern of an MTJ element MTJ having tapered side walls, and the recess 24 defines the pattern of the upper electrode 14.

Next, as shown in FIG. 18, the template 20 is set into contact with the resist 15. As a result, the recesses 21, 23 and 24 made in the template 20 are filled with the resist 15. Then, light is applied to the resist 15 that remains in contact with the resist 15. The resist 15 is thereby cured. The resist 15 and the template 20 are then separated from each other. That is, the template 20 used as a mold is released from the resist 15.

Then, as shown in FIG. 19, the upper electrode 14, the MTJ material layer 10 and the lower electrode 9 are processed by anisotropic etching, such as RIE or IBE, or milling, using the resist 15 as a mask.

As a result, three layers comprising the upper electrode 14, MTJ element MTJ and lower electrode 9 can be processed by performing PEP only once, as shown in FIG. 20. In addition, the sidewalls of only the MTJ element MTJ can be tapered.

[3-2] Effect

The third embodiment can achieve the same advantages as the first and second embodiments. Further, the third embodiment is advantageous in the following respect.

In the second embodiment, the etching mask (resist 17) for the lower electrode 9 is formed by photolithography. Instead, nano-imprint lithography may be performed in order to form the etching mask for the lower electrode 9. In this case, however, the template must be pressed onto the surface having a projection pattern of MTJ elements MTJ. Hence, the template may be broken in the second embodiment, if misalignment occurs.

By contrast, in the third embodiment, recesses 21, 23 and 24, defining the three patterns of the lower electrode 9, MTJ element MTJ and upper electrode 14, respectively, are made in the template 20 simultaneously. Then, using the resist 15 processed by the use of this template 20, the lower electrode 9, upper electrode 13 and MTJ material layer 10 are processed simultaneously. Thus, nano-imprint lithography need not be performed on the projection-depression pattern. Therefore, there is no risk of breaking the template.

[4] Fourth Embodiment

Memories using new materials, such as magnetic random access memories, are manufactured by the back-end process. Such magnetic random access memory can therefore be easily incorporated into the wiring layers of logic sections. The magnetic random access memory is therefore expected to be used as non-volatile, large-capacity RAM in embedded memories. In view of the characteristics inherent to logic products, however, a product containing the memory is included in the basic library of the logic product group. Further, in order to apply the memory to various products in the library, the memory must be manufactured without damaging the dimension in the film-thickness direction of the logic section and the electrical characteristics of the logic section. It is difficult, however, to manufacture such memory in this manner.

This technical point will be explained in detail. The height of metal 1 (M1) wiring in the logic section determines the circuit characteristics such as wiring delay. Any embedded memory must be designed in compliance with the height of metal M1. In any magnetic random access memory, however, the memory cell section may have wirings having a height larger than that of metal M1. To impart the same height to the wirings in the memory section and metal M1 in the logic section, it is desired that a wiring layer having the wirings of the memory cell section and the metal M1 of the logic section which has a different height from those of the wirings of the memory cell section be formed in the same plane.

In the fourth embodiment, wirings are formed by using a template designed to form the wirings of the memory cell section that are higher than the wirings of the logic section, and the contacts of the memory cell section are deeper than those of the logic section. Thus, wiring layers having different heights are formed in the same plane, in the memory cell section and the logic section, respectively.

[4-1] Manufacturing Method

FIG. 21 to FIG. 29 are sectional views explaining the sequence of manufacturing an embedded memory according to a fourth embodiment of this invention. A method of manufacturing the embedded memory according to the fourth embodiment will be explained below.

Figure 21:
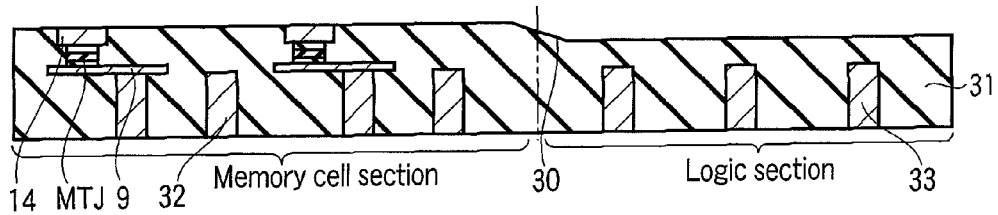
FIGS. 21, 22, 23, 24, 25, 26, 27, 28 and 29 are sectional views explaining the sequence of manufacturing a magnetic random access memory according to a fourth embodiment of this invention.

First, a structure is formed. As shown in FIG. 21, the structure has a memory cell section including MTJ elements MTJ and a logic section. The memory cell section and the logic section have upper surfaces that differ in height. More specifically, lithography has been so performed on two parts separated at the broken-wiring boundary. Then a step 30 is formed at an interlayer insulating film 31 by for example RIE. The step is inclined by for example CMP.

Figure 22:
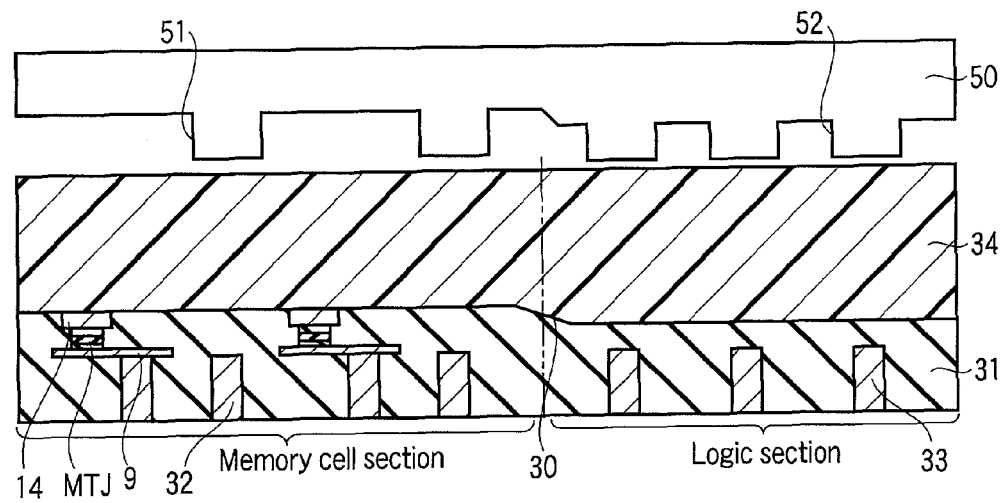

Next, as shown in FIG. 22, an interlayer insulating film 31 is coated with a resist 34, by means of spin coating in this case. The resist 34 therefore has a flat surface, having no steps at all. Meanwhile, a template 50 is prepared, which has projections 51 in the memory cell section, and projections 52 in the logic section. The projections 51 differ in height from the projections 52. The projections 51 define the wiring pattern of the memory cell section, and the projections 52 define the wiring pattern of the logic section. The projections 52 extend further downwards than the projections 51.

Figure 23:
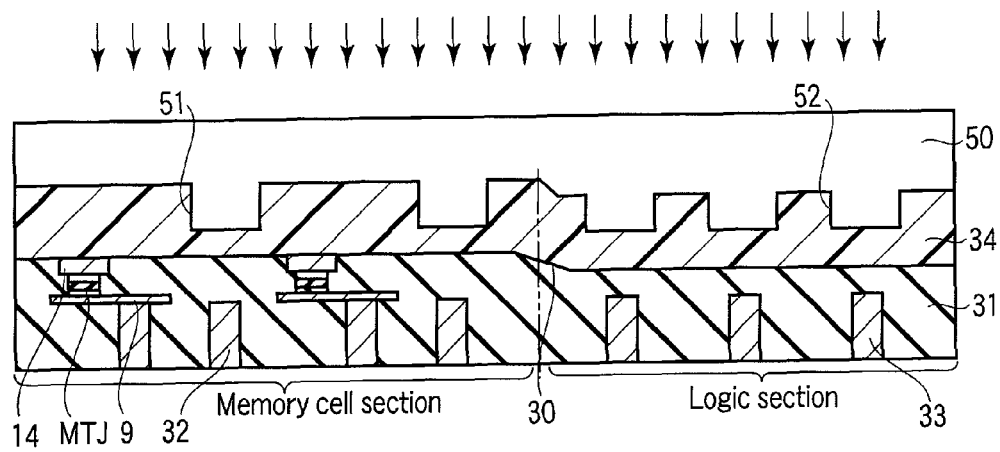

Next, as shown in FIG. 23, the template 50 is set into contact with the resist 34. As a result, the projections 51 and projections 52 are covered with the resist 34. At this point, the step 30 between the memory cell section and the logic section is formed by the above-mentioned process of forming a slope. The step 30, i.e., boundary between the memory cell section and the logic section, is a global step that is, for example 0.3 µm or more wide. No undesirable events, such as damage to the template 50, will therefore result. Thereafter, the structure is exposed to light, whereby the resist 34 is cured.

Figure 24:
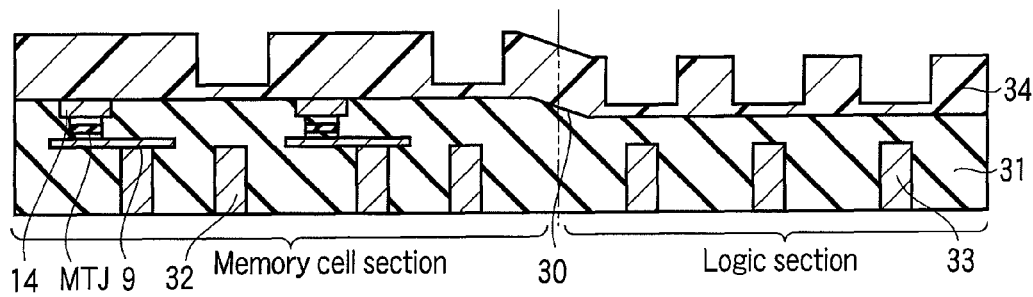

Then, as shown in FIG. 24, the resist 34 and the template 50 are separated from each other. That is, the template 50 used as a mold is released from the resist 34. A mask (resist 34) for metal-damascene etching is thereby formed. The bottoms of the grooves made in the resist 34 are defined by the pattern of projections 51 and 52 the template 50 has. The tops of those parts of the resist 34 that exit in the memory cell section are at a high level, while the tops of those parts of the resist 34 that exit in the logic section are at a low level.

Figure 25:
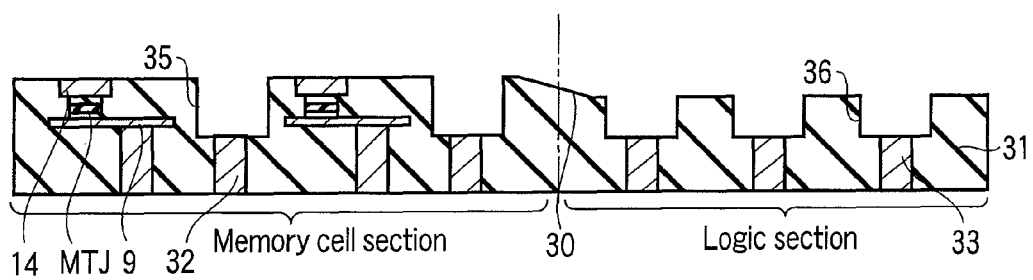

Further, as shown in FIG. 25, an interlayer insulating film 31 is etched, exposing contacts 32 and contacts 33. Damascene grooves 35 and damascene grooves 36 are thereby formed. If the same rate etching process is performed reflecting the shapes of the projections 51, 52 and the resist 34, the damascene grooves 35 in the memory cell section will be deep and the damascene grooves 36 in the logic section will be shallow.

Figure 26:
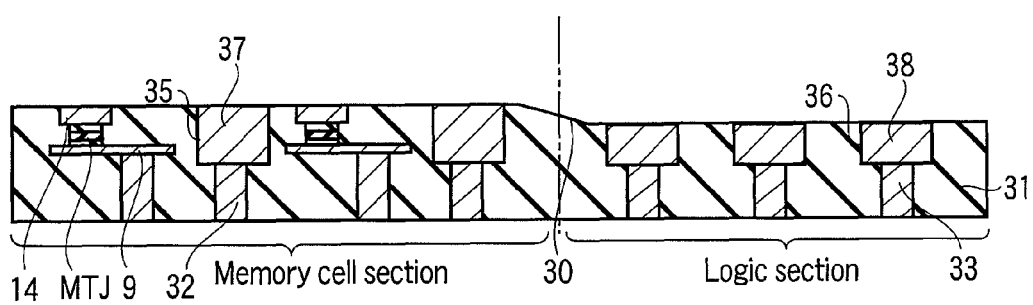

Next, as shown in FIG. 26, the damascene grooves 35 and the damascene grooves 36 are filled with a metal such as Cu by means of plating. The resultant structure is made flat at the top by means of, for example, CMP. As a result, Cu wirings 37 and Cu wirings 38, which are different in height from the Cu wirings 37, are formed simultaneously in the same plane. In this case, the CMP stops at the interlayer insulating film 31. The process therefore has no problems in spite of the existence of a global step 30.

Figure 27:
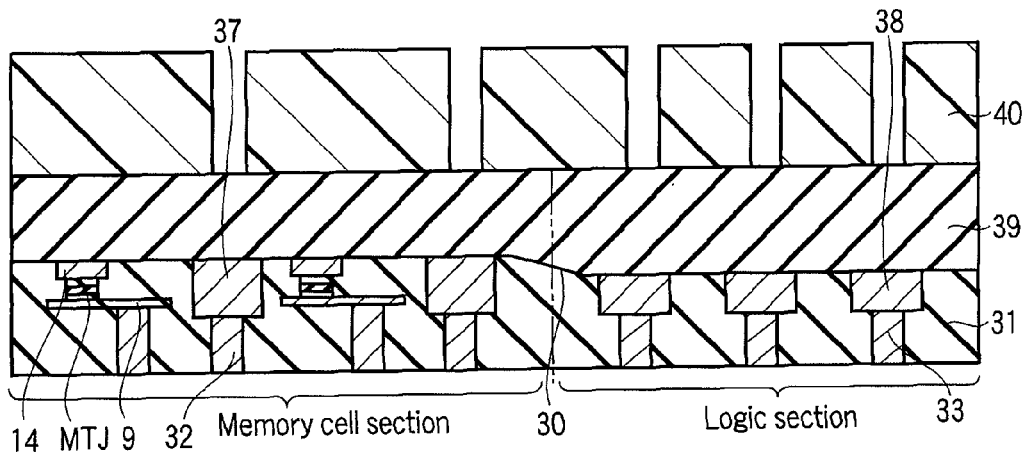

Thereafter, as shown in FIG. 27, an interlayer insulating film 39 is deposited on the wirings 37, wirings 38 and interlayer insulating film 31. The resultant structure is then made flat at the top by means of, for example, CMP. Further, the interlayer insulating film 39 is coated with resist 40. The resist 40 is subjected to patterning.

Figure 28:
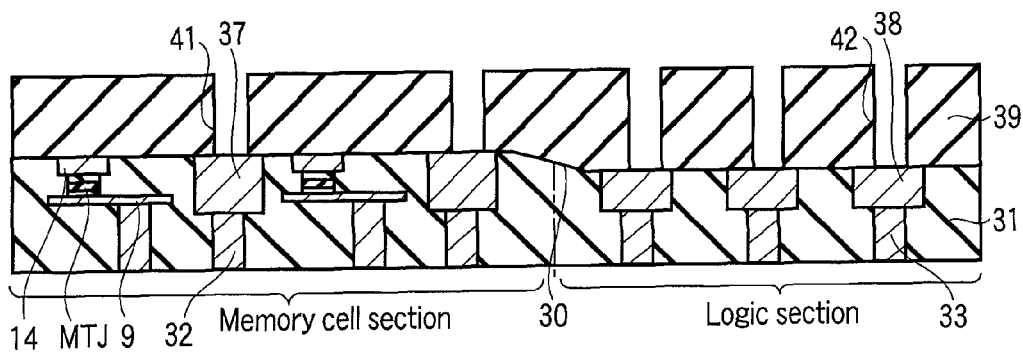

Then, as shown in FIG. 28, the interlayer insulating film 39 is etched in the same manner as in the ordinary via process.

Via holes 41 and via holes 42 are thereby made in the interlayer insulating film 39. Thereafter, the resist 40 is removed.

Figure 29:
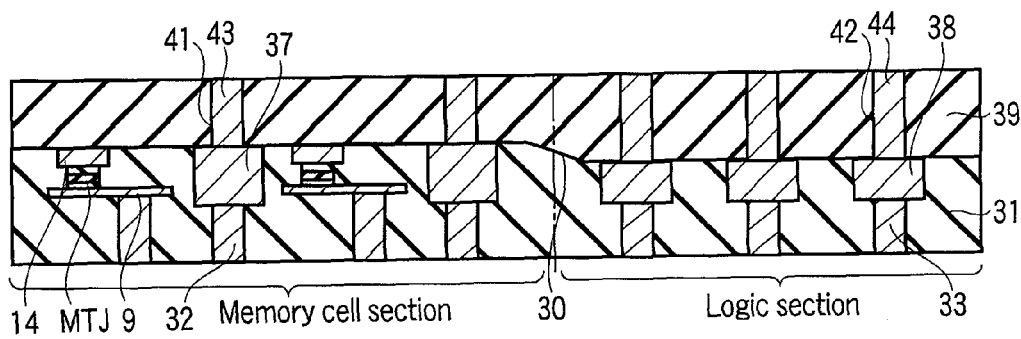

Further, as shown in FIG. 29, the via holes 41 and the via holes 42 are filled with a metal such as Cu. The top of the resultant structure is made flat by means of, for example, CMP.

Vias 43 connected to the wirings 37, and vias 44 connected to the wirings 38 are thereby formed.

[4-2] Effect

In the embedded memory according to the fourth embodiment, projections 51 and projections 52 different in height from the projections 51 are formed on the template 50 if the memory cell section and the logic section differ in terms of the wiring height. The wirings 37 and the wirings 38 different in height from the wirings 37 can therefore be formed in the same plane, by performing a single process. Any misalignment of the memory cell section and logic section can therefore be more reduced than in the case where the wirings 38 having one height and the wirings 39 having another height are formed at different times. This is very desirable for the chip manufacturing process.

[5] Fifth Embodiment

The fifth embodiment is a modification of the fourth embodiment. The fifth embodiment utilizes imprint lithography, thereby forming vias in the memory cell section and vias in the logic section, which differ in height from the vias formed in the memory section.

[5-1] Manufacturing Method

FIG. 30 to FIG. 34 are sectional views explaining the sequence of manufacturing an embedded memory according to a fifth embodiment of this invention. A method of manufacturing the embedded memory according to the fifth embodiment will be explained below.

Figure 30:
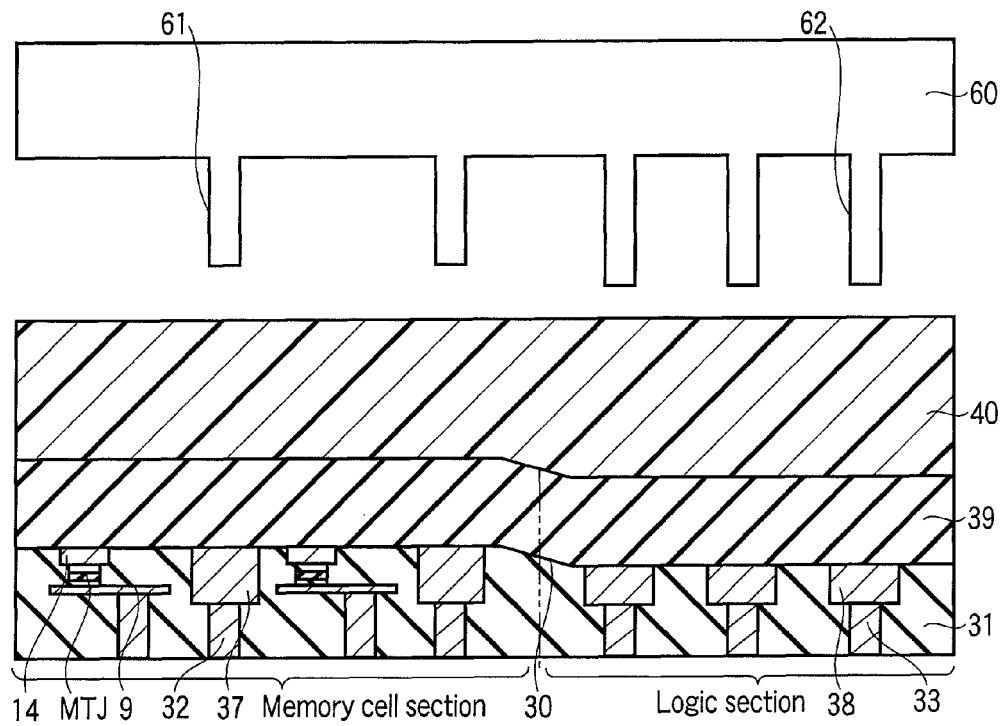
FIGS. 30, 31, 32, 33 and 34 are sectional views explaining the sequence of manufacturing a magnetic random access memory according to a fifth embodiment of this invention.

First, as shown in FIG. 30, Cu wirings 37 and Cu wirings 38, which are different in height from the Cu wirings 37, are formed altogether, simultaneously, in the same plane, respectively in the memory cell section and the logic section by the same method as in the fourth embodiment. Then, an interlayer insulating film 39 is deposited on the wirings 37, the wirings 38, and an interlayer insulating film 31. Next, the interlayer insulating film 39 is coated with a resist 40. Meanwhile, a template 60 is prepared, which has projections 61 in the memory cell section and projections 62 in the logic section. The projections 61 differ in height from the projections 62. The projections 61 define the wiring pattern of the memory cell section, and the projections 62 define the wiring pattern of the logic section. The projections 62 extend downwards further than the projections 61.

Figure 31:
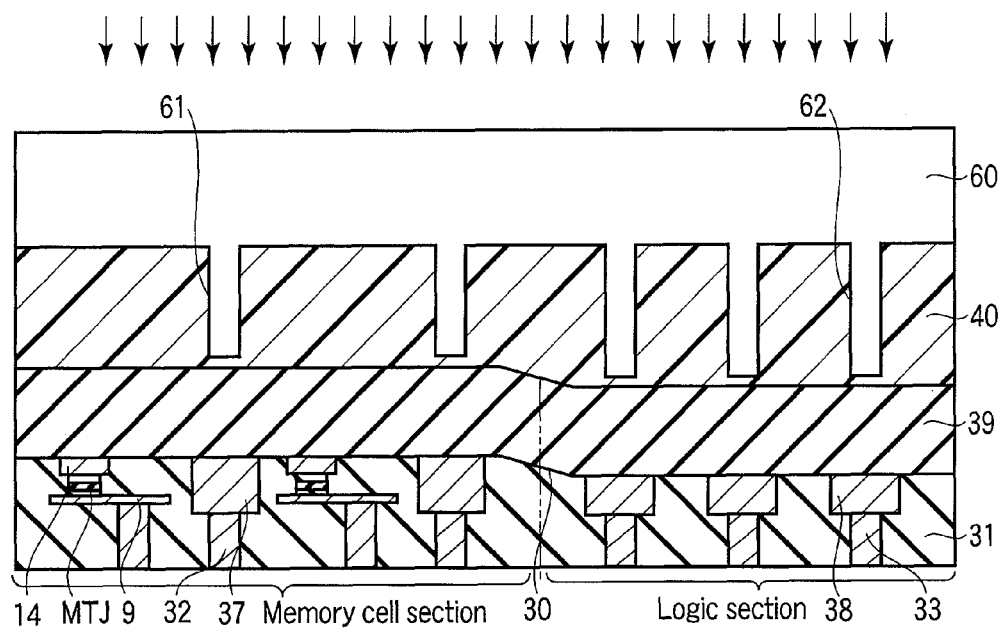

Next, as shown in FIG. 31, the template 60 is set into contact with the resist 40. As a result, the projections 61 and projections 62 are covered with the resist 40. Thereafter, the resultant structure is exposed to light, whereby the resist 40 is cured.

Figure 32:
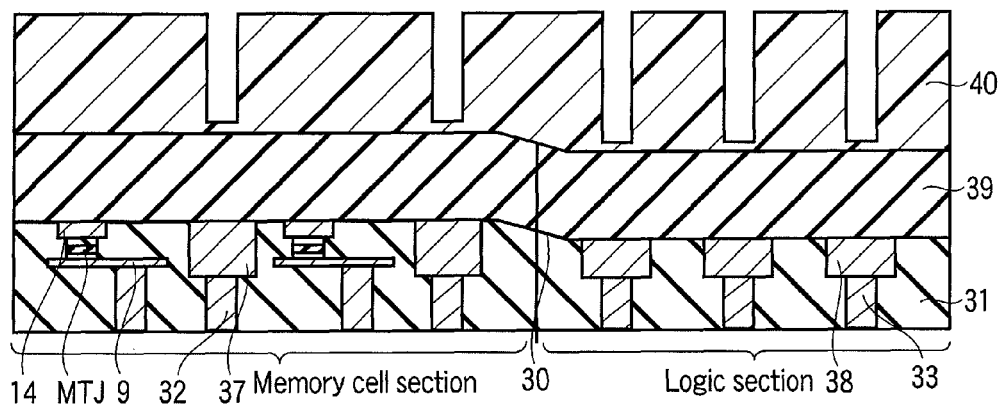

Further, as shown in FIG. 32, the resist 40 and the template 60 are then separated from each other. That is, the template 60 used as a mold is released from the resist 40. A mask (resist 40) for making via holes is thereby formed. The grooves made in the memory-cell section part of the resist 40 are shallow and the grooves made in the logic-section part of the resist 40 are deep, reflecting the patterns of the projections 61 and projections 62 of the template 60.

Figure 33:
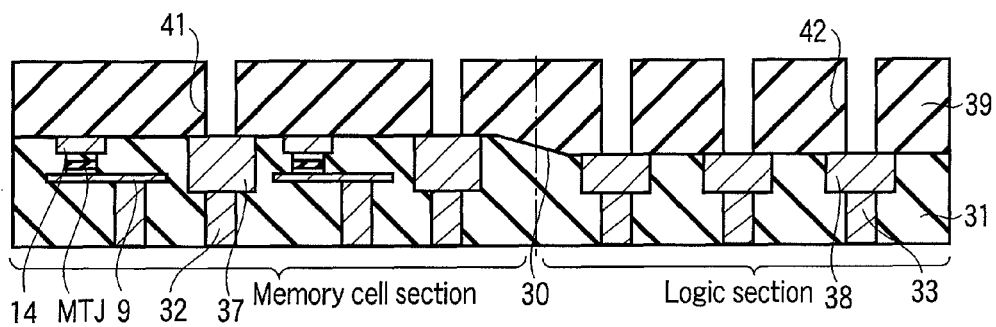

Then, as shown in FIG. 33, the interlayer insulating film 39 is etched, making via holes 41 and via holes 42. If the same rate etching process is performed reflecting the shapes of the projections 61, 62 of the template 60 and the resist 40, the via holes 41 made in the memory cell section will be shallow and the via holes 42 made in the logic section will be deep.

Figure 34:
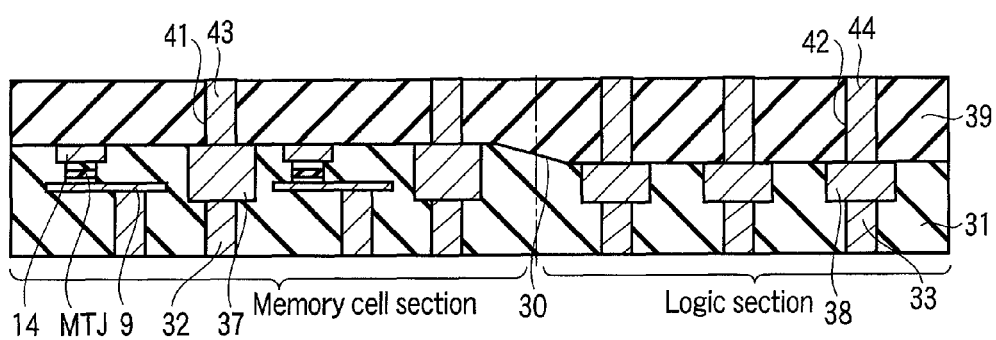

Further, as shown in FIG. 34, the via holes 41 and the via holes 42 are filled with a metal such as Cu. The top of the resultant structure is made flat by means of, for example, CMP. Vias 43 connected to the wirings 37 and vias 44 connected to the wirings 38 are thereby formed at the same time in the same plane.

[5-2] Effect

The fifth embodiment can achieve the same advantages as the fourth embodiment. Further, the fifth embodiment is advantageous in the following respect.

In the fourth embodiment, the via holes 41 and the via holes 42 different in depth from the via holes 41 must be made by using the same mask (resist 40) in the step of FIGS. 27 and 28. Consequently, the part of any wiring that is exposed through a via hole is inevitably scraped due to over etching. The wiring so scraped is degraded in reliability. Further, the over etching may result in the thinning of the mask.

On the other hand, in the fifth embodiment, the etching mask (resist 40) for the vias 43 connected to the wirings 37 and the vias 44 connected to the wirings 38 and different in height from the vias 43 are formed by means of nano-imprint lithography. Hence, the over etching can be uniform. Therefore, the fifth embodiment can be more reliable and has a larger process margin than the fourth embodiment.

[6] Sixth Embodiment

The sixth embodiment is a modification of the fifth embodiment. The sixth embodiment utilizes nano-imprinting, thereby forming an insulating film of a coating type.

[6-1] Manufacturing Method

FIG. 35 to FIG. 39 are sectional views explaining the sequence of manufacturing an embedded memory according to a sixth embodiment of this invention. A method of manufacturing the embedded memory according to the sixth embodiment will be explained below.

First, as shown in FIG. 35, wirings 37 and wirings 38 different from the wirings 37 in height are formed, respectively in the memory cell section and the logic section, simultaneously in the same plane by the same method as in the fourth embodiment. Next, a coating-type insulating film 70 comprising, for example, silsesquioxane and diyne additive, is formed on the wirings 37, the wirings 38, and an interlayer insulating film 31. More precisely, such coating-type insulating film 70 is formed by means of spin coating. Thus, the coating-type insulating film 70 has a flat upper surface having no steps.

Meanwhile, a template 60 is prepared. As in the fifth embodiment, the template 60 has projections 61 in the memory cell section, and has projections 62 different from the projections 61 in height in the logic section.

Next, as shown in FIG. 36, the template 60 is set into contact with the coating-type insulating film 70. As a result, the projections 61 and projections 62 are covered with the coating-type insulating film 70. Thereafter, ultraviolet rays are applied to the resultant structure, curing the coating-type insulating film 70.

Then, as shown in FIG. 37, the coating-type insulating film 70 and the template 60 are then separated from each other. That is, the template 60 used as a mold is released from the coating-type insulating film 70. Grooves 71 and grooves 72 are thereby made in the coating-type insulating film 70. The grooves 71 in the memory cell section are shallow and the grooves 72 in the logic section are deep, reflecting the patterns of the projections 61 and projections 62 of the template 60.

Next, as shown in FIG. 38, the coating-type insulating film 70 is etched, exposing the wirings 37 and the wirings 38. Via holes 41 and via holes 42 are thereby made. If the same rate etching process is performed reflecting the shapes of the projections 61, 62 and the coating-type insulating film 70, the via holes 41 made in the memory cell section will be shallow and the via holes 42 made in the logic section will be deep.

Further, as shown in FIG. 39, a metal such as Cu is embedded in the via holes 41 and the via holes 42. The resultant structure is made flat at the top, by means of CMP. As a result, vias 43 connected to the wirings 37, and vias 44 connected to the wirings 38 are formed at the same time in the same plane.

[6-2] Effect

The sixth embodiment can achieve the same advantages as the fourth and fifth embodiment. Further, the sixth embodiment is advantageous in the following respect.

In the sixth embodiment, a coating-type insulating film 70 is used in place of the via-forming resist 40 used in the fifth embodiment. Hence, the vias 43 and the vias 44 can be formed by etching, in only one nano-imprinting step. This reduces the number of process steps for forming the vias 43 and the vias 44 different in height from the vias 43.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a magnetic random access memory, comprising:
    forming a magnetic material for a magnetoresistive element, on a lower electrode;
    forming an upper electrode on the magnetic material;
    forming a resist for nano-imprint lithography, on the upper electrode;
    forming a first pattern or a second pattern in the resist by setting a first template or a second template into contact with the resist and curing the resist in such a manner that the first template comprises the first pattern corresponding to the magnetoresistive element and the lower electrode and the second template comprises the second pattern corresponding to the magnetoresistive element and the upper electrode; and
    patterning the magnetic material and the lower electrode at substantially the same time by using the resist comprising the first pattern, or patterning the magnetic material and the upper electrode at substantially the same time by using the resist comprising the second pattern.

2. The method of claim 1, wherein the second template further comprises a pattern of the lower electrode when the second template is used,
    the upper electrode, the magnetic material and the lower electrode are patterned at substantially the same time.

3. The method of claim 1, wherein the pattern of the magnetic material comprises tapered sidewalls.

4. The method of claim 3, wherein the tapered sidewalls comprise an angle ranging from 45° to 85°.

5. The method of claim 1, further comprising forming a magnetic layer on the lower electrode before forming the magnetic material on the lower electrode.

6. The method of claim 1, wherein the magnetic material comprises a fixing layer, a tunnel barrier layer and a recording layer on the lower electrode in order, and
    the fixing layer and the lower electrode are processed in the same size while patterning the magnetic material and the lower electrode at substantially the same time by using the resist comprising the first pattern.

7. The method of claim 1, wherein the patterning is performed by anisotropic etching or milling method.

8. A method of manufacturing an embedded memory comprising first wirings in a memory cell and second wirings in a logic portion differ in height, the method comprising:
    forming a first interlayer insulting film on a first contact of the memory cell and a second contact of the logic portion, the first interlayer insulting film comprising a step between the memory cell and the logic portion;
    forming a first resist for nano-imprint lithography, on the first interlayer insulating film;
    forming a pattern of the first wiring and a pattern of the second wiring in the first resist by setting a first template into contact with the first resist and curing the first resist, the first template comprising the patterns corresponding to the first and second wirings;
    forming a first wiring groove exposing the first contact and a second wiring groove exposing the second contact by patterning the first interlayer insulating film by using the first resist; and
    forming the first wiring and the second wiring different in height, on the same plane at substantially the same time by forming metal materials in the first and second wiring grooves.

9. The method of claim 8, wherein the step of the first interlayer insulating film is inclined at a boundary between the memory cell and the logic portion, and comprises a width of at least 0.3 μm.

10. The method of claim 8, further comprising:
    forming a second interlayer insulating film on the first interlayer insulating film, the first wiring and the second wiring, the second insulating film comprising a step located between the memory cell and the logic portion;
    forming a second resist for nano-imprint lithography, on the second interlayer insulating film;

forming the pattern of the first via and the pattern of the second via in the second resist by setting a second template comprising patterns of first and second vias, into contact with the second resist and curing the second resist;

forming a first via hole exposing the first wiring and a second via hole exposing the second wiring by patterning the second interlayer insulating film by using the second resist; and forming the first via and the second via different in height, in the same plane at substantially the same time by forming metal members in the first and second via holes.

11. The method of claim 8, further comprising:

forming a coating-type insulating film on the first interlayer insulating film, the first wiring and the second wiring;

forming the pattern of the first via and the pattern of the second via in the coating-type insulating film by setting a second template comprising patterns of first and second vias, into contact with the coating-type insulating film and curing the coating-type insulating film;

forming a first via hole exposing the first wiring and a second via hole exposing the second wiring by etching the coating-type insulating film; and forming the first via and the second via different in height, in the same plane at substantially the same time by forming metal materials in the first and second via holes.

12. The method of claim 11, wherein the coating-type insulating film comprises silsesquioxane and diyne additive.

13. The method of claim 11, wherein the coating-type insulating film is cured with ultraviolet rays.

* * * * *